(12) United States Patent
Lee et al.

(10) Patent No.: US 10,960,767 B2
(45) Date of Patent: Mar. 30, 2021

(54) LEAKAGE CURRENT CANCELLATION DEVICE AND VEHICLE SYSTEM INCLUDING THE SAME

(71) Applicants: HYUNDAI MOTOR COMPANY, Seoul (KR); KIA MOTORS CORPORATION, Seoul (KR)

(72) Inventors: Jaewon Lee, Hwaseong-si (KR); Myoungseok Lee, Hwaseong-si (KR); Dong Gyun Woo, Suwon-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 16/046,303

(22) Filed: Jul. 26, 2018

(65) Prior Publication Data
US 2019/0152324 A1 May 23, 2019

(30) Foreign Application Priority Data
Nov. 17, 2017 (KR) .......................... 10-2017-0153619

(51) Int. Cl.
| | |
|---|---|
| H02J 7/00 | (2006.01) |
| B60L 3/00 | (2019.01) |
| G01R 31/00 | (2006.01) |
| G01R 31/50 | (2020.01) |

(52) U.S. Cl.
CPC .......... B60L 3/0069 (2013.01); G01R 31/006 (2013.01); G01R 31/50 (2020.01); H02J 7/0026 (2013.01)

(58) Field of Classification Search
CPC .................................................. B60L 13/0069
USPC ........................................................ 320/109
See application file for complete search history.

(56) References Cited

U.S. PATENT DOCUMENTS

| | | | | |
|---|---|---|---|---|
| 8,242,739 | B2 * | 8/2012 | Krauer | B60L 3/0069 320/107 |
| 2004/0019441 | A1 * | 1/2004 | Larson | H02J 7/1453 702/63 |
| 2009/0218986 | A1 * | 9/2009 | Jarvinen | H01M 10/4207 320/119 |
| 2013/0187471 | A1 * | 7/2013 | Kim | H02J 1/10 307/66 |
| 2017/0254837 | A1 * | 9/2017 | Boden | G01R 19/0092 |

* cited by examiner

*Primary Examiner* — Yalkew Fantu
(74) *Attorney, Agent, or Firm* — Lempia Summerfield Katz LLC

(57) ABSTRACT

Disclosed is a leakage current cancellation device. The device includes a leakage detection resistor connected between a first node connected to a vehicle body ground of a vehicle and a second node connected to a second ground of an external power source. The devices further includes a voltage follower connected in parallel with the leakage detection resistor between the first and second nodes. The voltage follower cancels a potential difference between the first and second nodes.

4 Claims, 3 Drawing Sheets

LEAKAGE CURRENT CANCELLATION DEVICE AND VEHICLE SYSTEM INCLUDING THE SAME

CROSS-REFERENCE TO RELATED APPLICATION

This application claims priority to and the benefit of Korean Patent Application No. 10-2017-0153619 filed in the Korean Intellectual Property Office on Nov. 17, 2017, the entire contents of which are incorporated herein by reference.

BACKGROUND

(a) Field

An embodiment of the present invention relates to a leakage current cancellation device and a vehicle system including the same.

(b) Description of Related Art

Recently, interests in environmentally-friendly vehicles have been increased as environment regulations such as regulations about $CO_2$ emission have been more strictly enforced. Therefore, vehicle manufacturers actively conduct researches and developments on real electric vehicles or hydrogen vehicles as well as hybrid vehicles or plug-in hybrid vehicles.

A high-voltage battery is applied to the environmentally-friendly vehicle in order to store electrical energy obtained from various energy sources and provide the electrical energy as driving power for the vehicle. The high-voltage battery, which is applied to the vehicle, is charged by an on-board charger (OBC) in a state in which the high-voltage battery is mounted in the vehicle.

Typically, the OBC has an insulation electric transformer equipped therein and separates the vehicle and an AC power source for charging. The separation between the vehicle and the AC power source, which is implemented by using the insulation electric transformer, prevents a leakage current and enables a stable charging operation, but since the insulation electric transformer is added, a size, a weight, and costs of the OBC are increased.

The above information disclosed in this Background section is only for enhancement of understanding of the background of the invention and therefore it may contain information that does not form the prior art that is already known in this country to a person of ordinary skill in the art.

The disclosure of this section is to provide background of the invention. Applicant notes that this section may contain information available before this application. However, by providing this section, Applicant does not admit that any information contained in this section constitutes prior art.

SUMMARY

The present disclosure has been made in an effort to provide a leakage current cancellation device for effectively canceling a leakage current while charging a battery mounted in a vehicle, and a vehicle system including the same.

An embodiment of the present invention provides a leakage current cancellation device including: a leakage detection resistor connected between a first node connected to a vehicle body ground of a vehicle and a second node connected to a second ground of an external power source; and a voltage follower connected in parallel with the leakage detection resistor between the first and second nodes, and canceling a potential difference between the first and second nodes.

The leakage current cancellation device may further include an insulation power supply device supplying power in which electric potential of the second node is reference electric potential, as power for operating the voltage follower.

The voltage follower may include an operational amplifier OP-AMP which includes an output terminal connected to the first node, a non-inverting input terminal connected to the second node, and an inverting input terminal connected to the output terminal.

Another embodiment of the present invention provides a vehicle system including: a power conversion device connected between a first battery of a vehicle and an external power source, and converting input voltage inputted from the external power source into charging voltage for the first battery; a leakage detection resistor connected between a first node connected to a vehicle body ground of the vehicle and a second node connected to a second ground of the external power source; and a voltage follower connected in parallel with the leakage detection resistor between the first and second nodes, and canceling a potential difference between the first and second nodes.

The vehicle system may further include: a second battery; and an insulation power supply device supplying insulation power from the second battery in a state in which electric potential of the second node is reference electric potential, in which the insulation power is power for operating the voltage follower.

In the vehicle system, the voltage follower may include an operational amplifier OP-AMP which includes an output terminal connected to the first node, a non-inverting input terminal connected to the second node, and an inverting input terminal connected to the output terminal.

Any one of two electrode terminals of the second battery may be electrically connected to the vehicle body ground.

The vehicle system may further include a capacitor connected between the vehicle body ground and any one of output terminals of the power conversion device.

According to embodiments, there is an effect of performing a stable charging operation by effectively canceling a leakage current leaking to an external power source while charging a battery mounted in a vehicle by using the external power source.

DETAILED DESCRIPTION OF THE EMBODIMENTS

Figure 1:
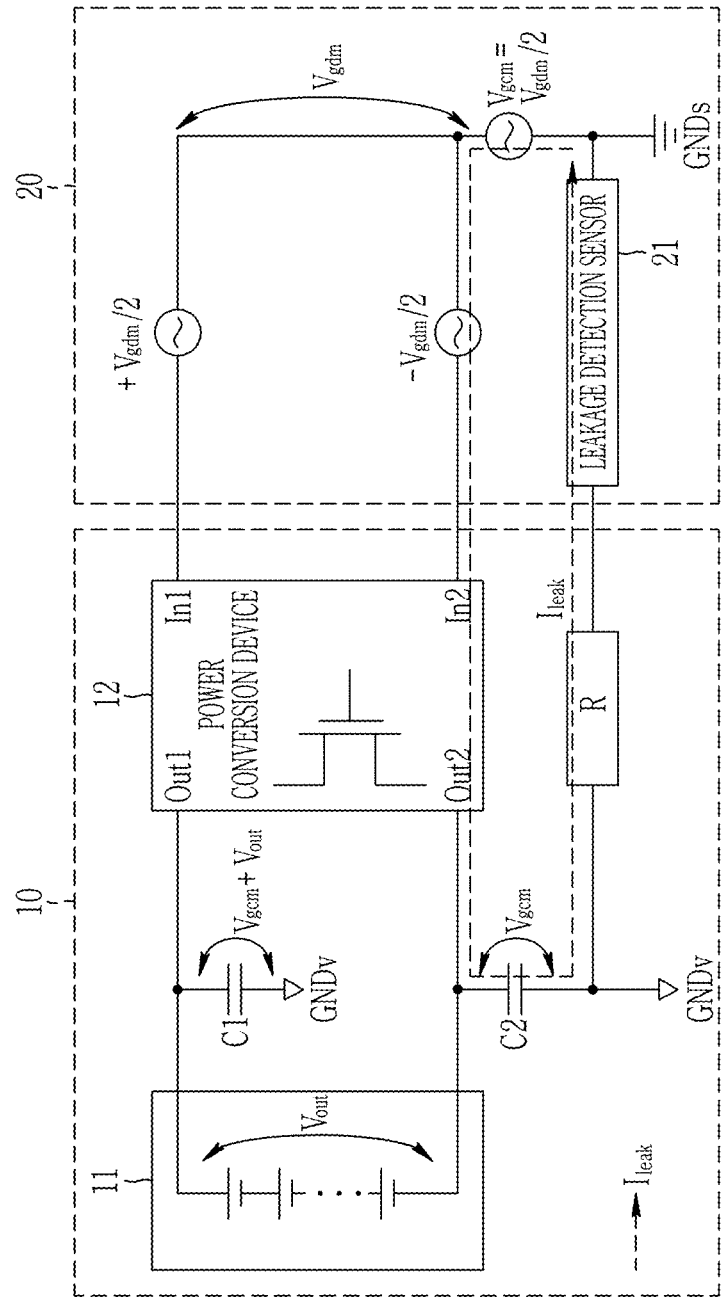
FIG. 1 is a view for explaining a path in which a leakage current occurs during a process of charging a battery in a vehicle.

Hereinafter, embodiments of the present invention will be described in detail with reference to the accompanying drawings so that those skilled in the technical field to which the present invention pertains may easily carry out the embodiments. The present invention may be implemented in various different ways, and is not limited to the embodiments described herein.

A part irrelevant to the description will be omitted to clearly describe embodiments of the present invention, and the same or similar constituent elements will be designated by the same reference numerals throughout the specification.

Throughout this specification and the claims that follow, when it is described that an element is "coupled" to another element, the element may be "directly coupled" to the other element or "electrically coupled" to the other element through a third element. Hereinafter, prior to the description of an embodiment of the present invention, a path in which a leakage current occurs during a process of charging a battery in a vehicle will be described.

A device for preventing (reducing) leak current when charging a battery of a vehicle is disclosed. A hybrid/electric vehicle includes a rechargeable battery for driving its motor.

When a charging plug of a charging station (20, power supply system) is plugged, the charging station's ground (GNDs) is connected to the vehicle's ground (GNDv) to have a common ground. The charging station includes a leakage detection sensor 21 interposed between the charging station's ground (GNDs) and the vehicle's ground (GNDv) and configured to sense a current flowing between the two grounds (GNDs, GNDv). When a current flowing between the two grounds (current leak) is detected by sensor 21, the charging station stops/pauses charging the vehicle's battery.

In embodiments, the vehicle includes a leakage current cancellation device 130. The device includes a resistor (R) connecting the vehicle's ground (GNDv) and one terminal of the leakage detection sensor 21. The device 130 further includes an operational amplifier (OP-AMP) circuit. In the OP-AMP circuit, output node of the OP-AMP is connected to one terminal (NA, vehicle side terminal) of the resistor (R) and one input of the OP-AMP is connected to the other terminal (NB) of the resistor (R). The output the OP-AMP is connected to another input of the OP AMP to provide a negative feedback of OP-AMP output. The OP-AMP circuit is configured to maintain the two terminals of the resistor (R) at the same voltage. The OP-AMP circuit is configured to provide a reverse current having a magnitude equal to a magnitude of the leakage current from the vehicle body's ground to the charging station's ground such that current flowing the leakage detection resistor is canceled to zero.

FIG. 1 is a view for explaining the path in which the leakage current occurs during the process of charging the battery in the vehicle.

Referring to FIG. 1, a power supply system 20 is a power supply system such as electric vehicle supply equipment (EVSE) and an in-cable control box (ICCB) disposed outside the vehicle, and provides power for charging a battery 11 mounted in the vehicle 10.

When an on-board charger (OBC) is connected to the power supply system 20 in order to charge the battery 11 in the vehicle 10, a vehicle body (chassis) of the vehicle 10, that is, a vehicle body ground GNDv is electrically connected to a ground GNDs of the power supply system 20 (hereinafter, referred to as a 'system ground').

In addition, a power conversion device 12 of the OBC receives alternating current (AC) voltage from the power supply system 20 through input terminals In1 and In2, converts the alternating current (AC) voltage to direct current (DC) voltage, and outputs the direct current (DC) voltage to output terminals Out1 and Out2. Output voltage $V_{out}$ outputted from the power conversion device 12 is supplied as charging voltage for the battery 11.

In a case in which the power supply system 20 is an asymmetric single-phase power source, assuming that the alternating current voltage inputted to the powerz conversion device 12 includes a common mode component $V_{gcm}$ and a differential mode component $V_{gdm}$, electric potential of the input terminal In1 may be expressed as $V_{gcm}+V_{gdm}/2$, and electric potential of the remaining input terminal In2 may be expressed as $V_{gcm}-V_{gdm}/2$. In addition, a potential difference between the output terminals Out1 and Out2 of the power conversion device 12 is constant as $V_{out}$, but the output terminals Out1 and Out2 of the power conversion device 12 are connected, in a non-insulated manner, to the power supply system 20, such that electric potential of the output terminal Out2 is $V_{gcm}$, and electric potential of the remaining output terminal Out1 is $V_{gcm}+V_{out}$.

Therefore, the common mode component of the voltage is applied, to the extent of $V_{gcm}$, to both ends of capacitors C1 and C2 connected to the output terminals Out1 and Out2 of the power conversion device 12, and a leakage current flows through the capacitors C1 and C2 due to $V_{gcm}$ having a frequency of the AC power source.

Typically, the power supply system 20 is provided with a leakage detection sensor 21 for detecting a leakage current $I_{leak}$ that occurs in the vehicle 10. Further, when the leakage detection sensor 21 detects the leakage current, a flow of a charging current supplied to the battery 11 in the vehicle 10 is cut off. Therefore, the occurrence of the leakage current $I_{leak}$ may cause a situation in which the battery 11 in the vehicle 10 may not be charged.

Therefore, an embodiment of the present invention provides a leakage current cancellation device for effectively canceling the leakage current that occurs during a process of charging the battery in the vehicle, such that a stable charging operation is performed.

Hereinafter, the leakage current cancellation device and a vehicle system including the same according to embodiments will be described in detail with reference to the drawings.

Figure 2:
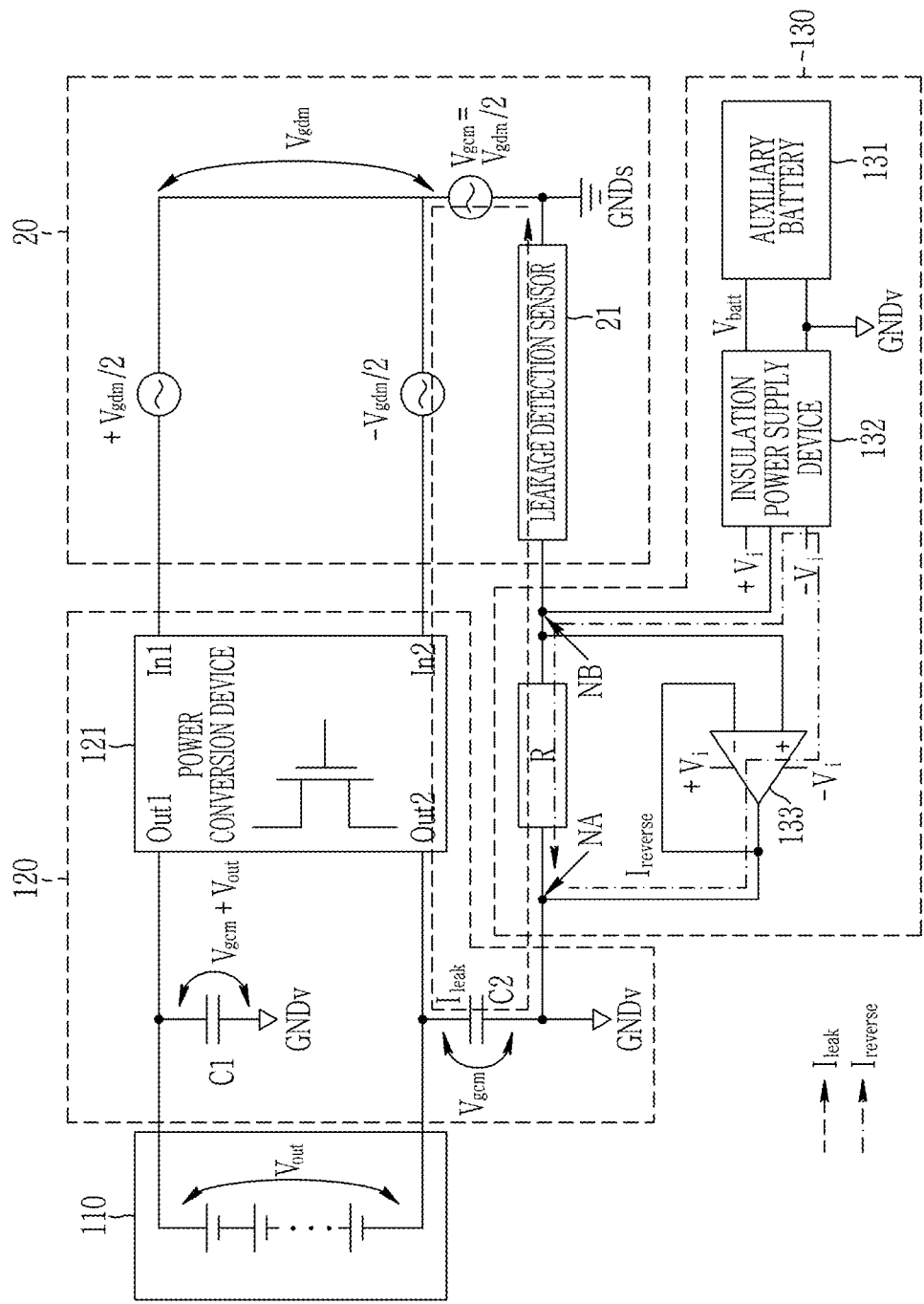
FIG. 2 is a view schematically illustrating a leakage current cancellation device and a vehicle system including the same according to an embodiment of the present invention.

FIG. 2 is a view schematically illustrating the leakage current cancellation device and the vehicle system including the same according to an embodiment of the present invention.

Referring to FIG. 2, a vehicle system according to an embodiment of the present invention may include a main battery 110, a charging device 120, and a leakage current cancellation device 130.

The main battery 110 is a secondary battery which is chargeable and dischargeable, and the main battery 110 may be a high-voltage battery for providing driving power to the vehicle.

The charging device 120 is a device for charging the main battery 110 with electric power supplied from the power supply system 20, and may include a power conversion device 121. In addition, the charging device 120 may further include the capacitors C1 and C2 which are connected between the vehicle body ground GNDv and the output terminals Out1 and Out2 of the power conversion device 121. The charging device 120 may be mounted in the OBC in the vehicle.

The power conversion device 121 may be connected between the main battery 110 and the power supply system 20 and may convert alternating current voltage applied from the power supply system 20 into direct current voltage for charging the main battery 110 and supply the direct current voltage to the main battery 110.

The leakage current cancellation device 130 is a device for reducing a current leaking from the vehicle system to the power supply system 20, and the leakage current cancellation device 130 may include a leakage detection resistor R, an auxiliary battery 131, an insulation power supply device 132, and a voltage follower 133.

The leakage detection resistor R may be used to detect the current $I_{leak}$ that leaks from the vehicle system to the power supply system 20. To this end, any one terminal of the leakage detection resistor R is connected to the vehicle body ground GNDv, and the remaining terminal of the leakage detection resistor R is connected to the system ground GNDs of the power supply system 20 through the leakage detection sensor 21, and in the present specification, nodes, which correspond to the two terminals of the leakage detection resistor R, are referred to as a first node NA and a second node NB, respectively.

The auxiliary battery 131 may be used to supply power for operating the voltage follower 133 to be described below. Any one of the output terminals of the auxiliary battery 131 is electrically connected to the vehicle body ground GNDv and may be operated based on the vehicle body ground GNDv as reference electric potential.

The insulation power supply device 132 receives output voltage of the auxiliary battery 131, and may provide insulation power, which is insulated from the output voltage, as power for operating the voltage follower 133. In the case of the insulation power provided by the insulation power supply device 132, electric potential of the second node NB, instead of electric potential of the vehicle body ground GNDv, is reference electric potential. Therefore, the voltage follower 133 may be operated by operating voltage in a state in which electric potential of the second node NB is reference electric potential.

The voltage follower 133 includes an operational amplifier (OP-AMP) connected in parallel with the leakage detection resistor R between the first and second nodes NA and NB, and the voltage follower 133 may serve to cancel the leakage current $I_{leak}$ flowing to the system ground GNDs of the power supply system 20 by using the leakage detection resistor R. A non-inverting input terminal of the OP-AMP, which constitutes the voltage follower 133, is connected to the reference electric potential of the insulation power supply device 132, that is, the second node NB, an inverting input terminal is connected to an output terminal of the OP-AMP, and the output terminal is connected to the first node NA. The voltage follower 133 is operated as a non-inverting amplifier having an amplification gain of 1, and may serve as a buffer which outputs the input voltage (voltage of the second node NB) as the output voltage (voltage of the first node NA) as it is.

In a case in which the power supply system 20 supplies asymmetric single-phase power, the leakage current $I_{leak}$ flowing to the capacitor C2 may occur due to $V_{gcm}$ that is a common mode component of the asymmetric single-phase power. The leakage current $I_{leak}$ flows to the power supply system 20 through the leakage detection resistor R, thereby generating potential difference $I_{leak} \times R$ between the both ends of the leakage detection resistor R, that is, between the first and second nodes NA and NB.

According to the aforementioned description, the output voltage and the input voltage of the voltage follower 133 have the same properties. Because of this property, a potential difference between the first and second nodes NA and NB, which are connected to an output terminal and an input terminal of the voltage follower 133, respectively, is removed, and for this reason, such that no current flows through the leakage detection resistor R. That is, the voltage follower 133 generates a reverse current $I_{reverse}$ having a magnitude equal to a magnitude of the leakage current Leak, thereby cancelling the leakage current $I_{leak}$ and converging the current flowing through the leakage detection resistor R to 0.

Therefore, consequently, the leakage current is prevented from being introduced into the power supply system 20, thereby enabling a stable charging operation.

Figure 3:
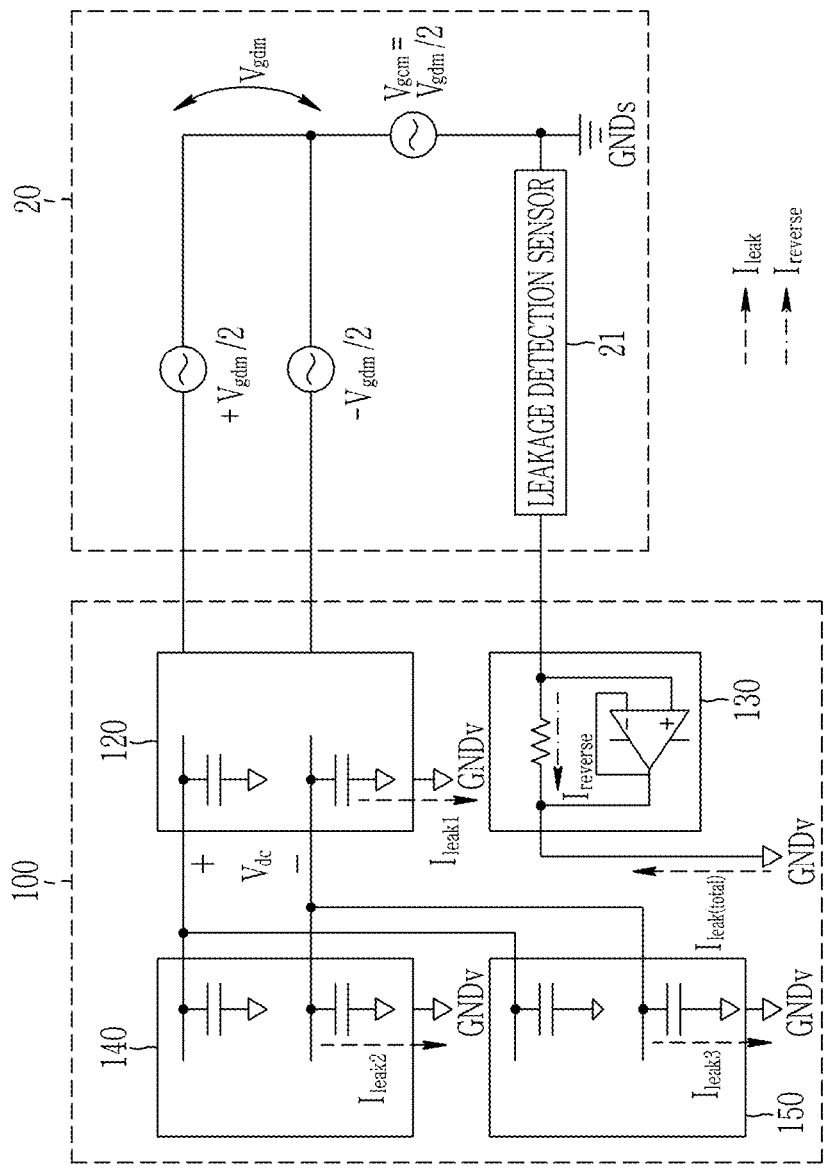
FIG. 3 is a view for explaining a method of canceling a leakage current in the entire vehicle system by using the leakage current cancellation device according to an embodiment of the present invention.

FIG. 3 is a view for explaining a method of canceling a leakage current in the entire vehicle system by using the leakage current cancellation device according to an embodiment of the present invention.

Referring to FIG. 3, in a vehicle system 100 according to an embodiment of the present invention, various high-voltage devices 140 and 150 as well as the charging device 120 are connected to the main battery 110. Therefore, the output terminal of the charging device 120, that is, the output terminal of the power conversion device 121 may be electrically connected to the various high-voltage devices 140 and 150 as well as the main battery 110. For example, an inverter, a BMS, and the like may be electrically connected to the output terminal of the power conversion device 121.

Therefore, the high-voltage devices 140 and 150 are also connected, in a non-insulated manner, to the power supply system 20 through the vehicle body ground GNDv, and the high-voltage devices 140 and 150, together with a charging circuit 120, may generate leakage currents $I_{leak1}$, $I_{leak2}$, and $I_{leak3}$ leaking from the vehicle system 100 to the power supply system 20.

The leakage currents $I_{leak1}$, $I_{leak2}$, and $I_{leak3}$, which are generated by the charging circuit 120 and the high-voltage devices 140 and 150, flow through the leakage detection resistor R connected between the vehicle body ground GNDv and the system ground GNDs of the power supply system 20 in a state in which the leakage currents $I_{leak1}$, $I_{leak2}$, and $I_{leak3}$ are combined ($i_{leak(total)}$), and the leakage currents may be cancelled by the reverse current $I_{reverse}$ generated by the leakage current cancellation device 130.

According to the aforementioned embodiment, there is an effect of performing a stable charging operation by effectively canceling the leakage current leaking to the power supply system 20 while charging the battery 110 in the vehicle in the state in which the external power supply system 20 is connected to the battery 110.

The computer-readable recording medium includes all types of recording devices on which data readable by a computer system is recorded. Examples of the computer-readable recording media include a ROM, a RAM, a CD-ROM, a DVD-ROM, a DVD-RAM, a magnetic tape, a floppy disk, a hard disk, an optical data storage device, and the like. In addition, the computer-readable recording medium may be distributed over computer systems connected to one another by a network, such that computer-readable codes may be stored and executed in the computer-readable recording medium in a decentralized manner.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims. Therefore, the embodiments may be easily selected and substituted by those skilled in the art. Further, those skilled in the art may omit some of the constituent elements described in the present specification without causing deterioration in performance or may add constituent elements in order to improve performances. Furthermore, those skilled in the art may change the order of the steps of the method described in the present specification in accordance with process environments or equipment. Therefore, the scope of the present invention can be determined based on the appended claims and the equivalents to the claims instead of the described embodiments.

DESCRIPTION OF SYMBOLS

20: Power supply system
100: Vehicle system
110: Main battery
120: Charging device
121: Power conversion device
130: Leakage current cancellation device
131: Auxiliary battery
132: Insulation power supply device
133: Voltage follower
140, 150: High-voltage device
R: Leakage detection resistor
C1, C2: Capacitor

What is claimed is:

1. A leakage current cancellation device comprising:
a leakage detection resistor connected between a first node connected to a vehicle body ground of a vehicle and a second node connected to a second ground of an external power source;
a voltage follower connected in parallel with the leakage detection resistor between the first and second nodes, and canceling a potential difference between the first and second nodes; and
an insulation power supply device supplying power in a state in which electric potential of the second node is a reference electric potential, as power for operating the voltage follower,
wherein the voltage follower includes an operational amplifier OP-AMP, which includes an output terminal connected to the first node, a non-inverting input terminal connected to the second node, and an inverting input terminal connected to the output terminal, and
wherein the voltage follower is operated as a non-inverting amplifier having an amplification gain of 1, such that a potential difference between the first node and the second node is removed and no leakage current flows through the leakage detection resistor.

2. A vehicle system comprising:
a power conversion device connected between a first battery of a vehicle and an external power source, and converting input voltage inputted from the external power source into charging voltage for the first battery;
a leakage detection resistor connected between a first node connected to a vehicle body ground of the vehicle and a second node connected to a second ground of the external power source;
a voltage follower connected in parallel with the leakage detection resistor between the first and second nodes, and canceling a potential difference between the first and second nodes;
a second battery; and
an insulation power supply device supplying insulation power from the second battery in a state in which electric potential of the second node is a reference electric potential,
wherein the voltage follower includes an operational amplifier OP-AMP, which includes an output terminal connected to the first node, a non-inverting input terminal connected to the second node, and an inverting input terminal connected to the output terminal,
wherein the voltage follower is operated as a non-inverting amplifier having an amplification gain of 1, such that a potential difference between the first node and the second node is removed and no leakage current flows through the leakage detection resistor, and
wherein the insulation power is power for operating the voltage follower.

3. The vehicle system of claim 2, wherein:
any one of two electrode terminals of the second battery is electrically connected to the vehicle body ground.

4. The vehicle system of claim 2, further comprising:
a capacitor connected between the vehicle body ground and any one of output terminals of the power conversion device.

* * * * *